United States Patent [19]
Willenz et al.

[11] Patent Number: 5,398,211
[45] Date of Patent: Mar. 14, 1995

[54] STRUCTURE AND METHOD FOR PROVIDING PRIORITIZED ARBITRATION IN A DUAL PORT MEMORY

[75] Inventors: Avigdor Willenz, Karmiel, Israel; Kelly A. Maas, San Jose, Calif.

[73] Assignee: Integrated Device Technology, Inc., Santa Clara, Calif.

[21] Appl. No.: 136,781

[22] Filed: Oct. 14, 1993

[51] Int. Cl.$^6$ .............................................. G11C 8/00
[52] U.S. Cl. ...................... 365/230.05; 365/230.02; 365/233; 365/189.02
[58] Field of Search ...................... 365/189.04, 189.02, 365/230.02, 230.05, 233, 189.05

[56] References Cited

U.S. PATENT DOCUMENTS

| | | | |
|---|---|---|---|
| 4,796,232 | 1/1989 | House | 365/230.05 |
| 4,967,398 | 10/1990 | Jamoua et al. | 365/230.05 |
| 5,001,671 | 3/1991 | Koo et al. | 365/230.05 |
| 5,142,540 | 8/1992 | Glasser | 365/230.05 |
| 5,276,842 | 1/1994 | Sugita | 365/230.05 |

*Primary Examiner*—Joseph A. Popek
*Attorney, Agent, or Firm*—Skjerven, Morrill MacPherson, Franklin & Friel

[57] ABSTRACT

An integrated circuit dual port memory provides a preferred port which is always granted priority of memory access when memory access requests arrive simultaneous from both ports of the dual port memory. To implement this priority scheme, the memory request signal from the preferred port controls a multiplexor to select the input signals from the preferred port over the input signals from the non-preferred port. The memory request signal from the preferred port also serves as a busy signal to block a simultaneous memory access by the non-preferred port. In one embodiment, memory request signals of both ports are latched into registers clocked by the same clock signal.

10 Claims, 4 Drawing Sheets

STRUCTURE AND METHOD FOR PROVIDING PRIORITIZED ARBITRATION IN A DUAL PORT MEMORY

BACKGROUND OF THE INVENTION

1. Field of the Invention

This invention relates to memory integrated circuits and, in particular, relates to multiport memory integrated circuits.

2. Discussion of the Related Art

In a high performance computer system, a dual-ported memory allows simultaneous memory access by, for example, both the central processor (CPU) and certain input and output (I/O) peripheral circuits. An example of such a computer system 100 is shown in FIG. 1. As shown in FIG. 1, computer system 100 comprises CPU 101, memory system 102, and I/O system 103. CPU 101 accesses memory system 102 via bus 104, and I/O system 103 accesses memory system 102 via bus 105. In computer system 100, both ports of a dual port memory are provided the same priority. Thus, when simultaneous memory accesses are pending at both ports, an arbitration circuit is necessary to resolve the order in which the memory is accessed. However, in many applications requiring a shared memory, e.g. in digital signal processors, certain devices often require immediate access on-demand. In those applications, a delay resulting from an existing memory access by another device, or due to latency in the arbitration circuit, may lose data unacceptably.

Various integrated circuit components have been designed to be used in a conventional memory array of a dual-port memory system. Such components include (i) QS7316 dual port random access memory (RAM), available from Quality Semiconductor Inc., Santa Clara, Calif.; (ii) M79018DX and M78004PX dual port RAMs, both available from AT&T Technologies Inc., Allentown, Pa., and (iii) various dual port SRAMs, e.g. IDT7133, from Integrated Device Technology, Inc., Santa Clara, Calif.

The QS7316 dual-port RAM referenced above is a clock-based dual port RAM supporting both random access and burst mode access from either or both ports. In the QS7316 dual-port RAM, neither port has a priority over the other port. However, the initial access latency in the QS7316 dual-port RAM is two to four clock cycles. The additional latency is required to synchronize accesses from both ports. Under burst mode, each port can be accessed every cycle after the initial access. The disadvantage of this component is the latency which is incurred when accessing either port.

The M79018DX and M78004PX components grant equal priority to the two ports of each component. Unlike the Q7316 integrated circuit, neither the M79018DX nor the M78004PX requires a clock signal input. However, in each of the M79018DX and the M78004PX components, memory access at one port can be held up for a long time period, while the memory access at the other port completes.

In the IDT7133 integrated circuit component, on-chip arbitration logic sets a busy flag to delay memory access by one of the ports, when simultaneous memory accesses from both ports occur. Under this scheme, memory access from either port may be blocked by the busy flag and be subject to an indefinite delay.

SUMMARY OF THE INVENTION

According to the present invention, a structure and a method allowing unrestricted memory access from a preferred port of a dual port memory are disclosed.

In one embodiment, whenever simultaneous memory accesses from both ports of a dual port memory are requested, a priority circuit in the dual port memory grants, at an edge of a clock signal, memory access to a preferred port, while providing a "busy" signal to block memory access by the other lower priority port. In this embodiment, registers are provided to store the data and the memory address associated with the blocked memory access. The stored data and address of the blocked memory access allows the blocked memory access to proceed immediately when the memory access at the preferred port is completed.

The present invention allows unrestricted memory access from the preferred port without incurring the latency characteristic of prior art arbitration circuits, and without requiring the memory access at the preferred port to wait for the completion of a prior memory access at the lower priority port. The present invention is suitable for an application in which memory access by one device is time-critical, such as in some real-time or digital signal processing applications.

The present invention is better understood upon consideration of the detailed description below, in conjunction with the accompanying drawings.

DETAILED DESCRIPTION OF THE PREFERRED EMBODIMENTS

Figure 1:
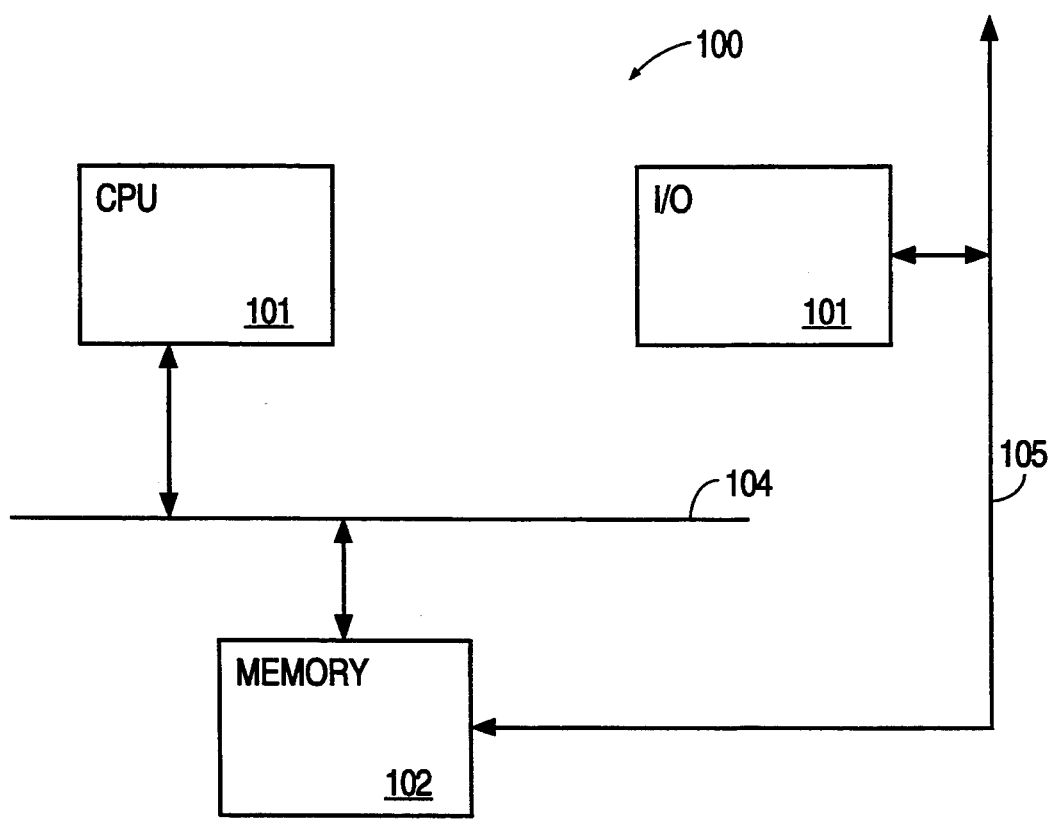
FIG. 1 shows a computer system 100 having a conventional dual-ported memory architecture.
Figure 2:
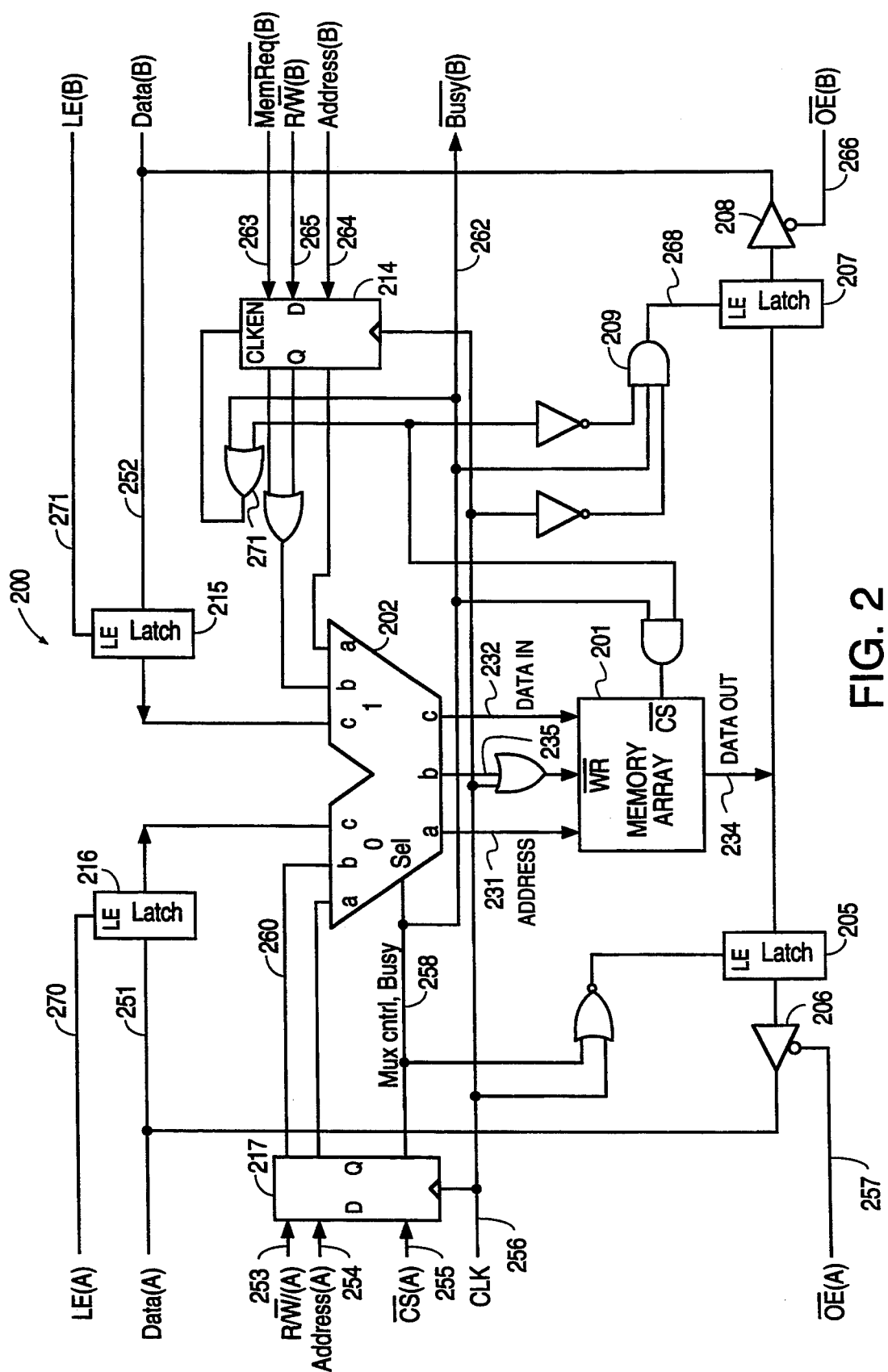
FIG. 2 shows the organization of a dual port memory 200, in accordance with the present invention.

One embodiment of the present invention is illustrated in FIG. 2. In this embodiment, an integrated circuit provides a dual port memory 200 that is accessible by ports A and B. In FIG. 2, port A is shown on the left hand side, and port B is shown on the right hand side.

As shown in FIG. 2, memory array 201 is accessed by an address presented on address bus 231. During a write operation, data on data bus 232 is written into memory array 201 when signal $\overline{WR}$ is asserted on lead 233. During a read operation, data stored at the accessed memory location is provided on data output bus 234.

Data from port A to be written into memory array 201 are provided on data bus 251 and received into latch 216 when latch enable signal LE(A) on lead 270 becomes active. Likewise, data from port B to be written into memory array 201 are provided on data bus 252 and received into latch 215 when latch enable signal LE(B) on lead 271 becomes active.

At port A, an access type signal R/$\overline{W}$(A) and address signals Address(A) are respectively provided on lead 253 and address bus 254. A control signal $\overline{CS}$(A) on lead 255 is asserted when a memory access request is pending at port A. A clock signal CLK provided on lead 256 enables register 217 to store signals Address(A), $\overline{CS}$(A), and R/$\overline{W}$(A). As an output signal (on lead 258) of register 217, control signal $\overline{CS}(A)$ directs, during a memory access from port A, multiplexer 202 to select as its output signals on data bus 232, lead 235 and address bus 231, respectively, latch 216's output data signals Data(A) on bus 259, register 217's output signal R/$\overline{W}$(A) signal on lead 260 and register 217's output address signals Address(A) on bus 261. The signal on lead 235 is gated with the clock signal CLK to provide the $\overline{WR}$ signal on bus 233. When a memory access from port A is pending, signal $\overline{CS}(A)$ is provided on lead 262 as a $\overline{Busy}$ signal to block memory access from port B.

Output enable signal $\overline{OE}(A)$ on lead 257 is asserted at the end of a read memory cycle to enable buffer 206 to place the data in latch 205 onto data bus 251. Latch 205 latches the output data of memory array 201 on data bus 234 during a read memory access from port A.

At port B, a memory request signal $\overline{MemReq}(B)$ on lead 263 indicates a pending memory request. Register 214 receives memory request signal $\overline{MemReq}(B)$ from lead 263, address signals Address(B) from address bus 264, and access type signal R/$\overline{W}$(B) from lead 265. Output enable signal $\overline{OE}(B)$ on lead 266 enables buffer 208 to place latch 207's output data on bus 267 onto data bus 252.

When $\overline{Busy}$ is not asserted, i.e. there is not a memory access pending from port A, and the last memory access from port A is completed, the $\overline{CS}(A)$ signal is inactive, so that multiplexer 202 selects latch 215's output data signals Data(B) for output on bus 232, register 214's access type signal R/$\overline{W}$(B) for output on lead 235, and register 214's address signals Address(B) for output on bus 231.

When a memory access from port B arrives during a memory cycle in which signal $\overline{Busy}$ is inactive, memory access is granted to port B. When a memory request from port B arrives in a memory cycle during which $\overline{Busy}$ is active, the memory access from port B is blocked, since the output of gate 271 is at logic low. Signal $\overline{Busy}$ also prevents latch 207 from latching the output data of memory array 201 on output data bus 234 by forcing, the output signal of AND gate 209 on lead 268 to logic low. The memory access from port B is not allowed to proceed until $\overline{Busy}$ is deasserted, enabling signal $\overline{MemReq}(B)$ to be received into register 214.

Since port A is always provided priority when memory accesses are requested from both ports simultaneously, i.e. prior to a rising clock edge of clock signal CLK, the present invention is suitable for use in applications in which one device requiring access to a memory system cannot afford to wait for the completion by another device accessing the memory. In the present embodiment, since the same clock signal is used to clock registers 214 and 217, a request in preferred port A is granted access with no latency incurred.

Figure 3:
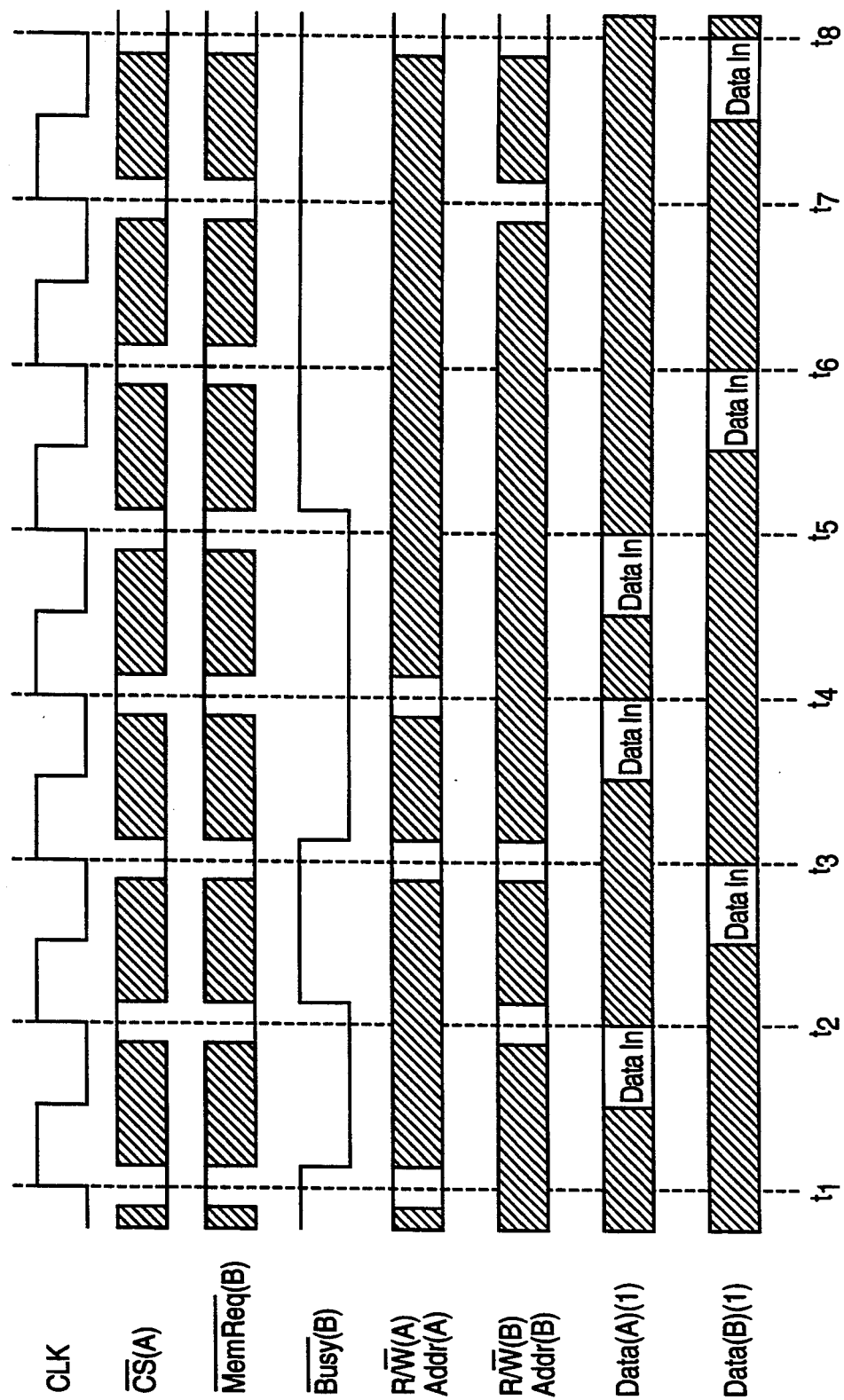
FIG. 3 is a timing diagram illustrating various write memory cycles of dual port memory 200.

FIG. 3 is a timing diagram illustrating various write memory cycles of dual port memory 200. As shown in FIG. 3, at time $t_1$, a write memory request arrives at port A, asserting $\overline{CS}(A)$, and providing the address signals Address(A) and access type signal R/$\overline{W}$(A). In response to this memory request from port A, signal $\overline{Busy}$ is asserted.

At time $t_1$, no memory request from port B is pending. The data provided on data bus 251 is written into memory array 201 at the end of the memory cycle of time $t_1$.

At time $t_2$, a write memory request arrives at port B, asserting signals $\overline{MemReq}(B)$ and R/$\overline{W}$(B), and providing address signals Address(B). Since no memory request from port A is pending, signal $\overline{Busy}$ is inactive. Consequently, the data provided on data bus 252 is written into memory array 201 at the end of the memory cycle of $t_2$.

At time $t_3$, both memory access request signals $\overline{CS}(A)$ and $\overline{MemReq}(B)$ are asserted. Consequently, signal $\overline{Busy}$ is asserted and memory access from port B is blocked. However, data on data bus 252 is received into latch 215, and the address signals Address(B) and the access type signal R/$\overline{W}$(B) are received into register 214. During the memory cycle of $t_3$, data received from data bus 251 (Data(A)) are written into memory array 201.

At time $t_4$, another memory access from port A blocks the pending memory access request at time $t_3$ from port B.

At time $t_5$, a port A memory request is not pending, so that signal $\overline{Busy}$ deasserted after the rising edge of the system clock CLK. Consequently, the pending memory request from port B at time $t_3$, which is stored in latch 215 and register 214, is allowed to proceed, so that the data in latch 215 is written into memory array 201.

During the memory cycle of time $t_6$, the $\overline{MemReq}(B)$ signal is not asserted and there is no pending memory access from port A. Thus, to memory array 201, the memory cycle of time $t_6$ is treated like a read memory cycle from port B. However, latch 207 is not enabled, so that the data on memory bus 234 is simply disregarded. The memory cycle of time $t_7$ is a regular write cycle from port B.

Figure 4:
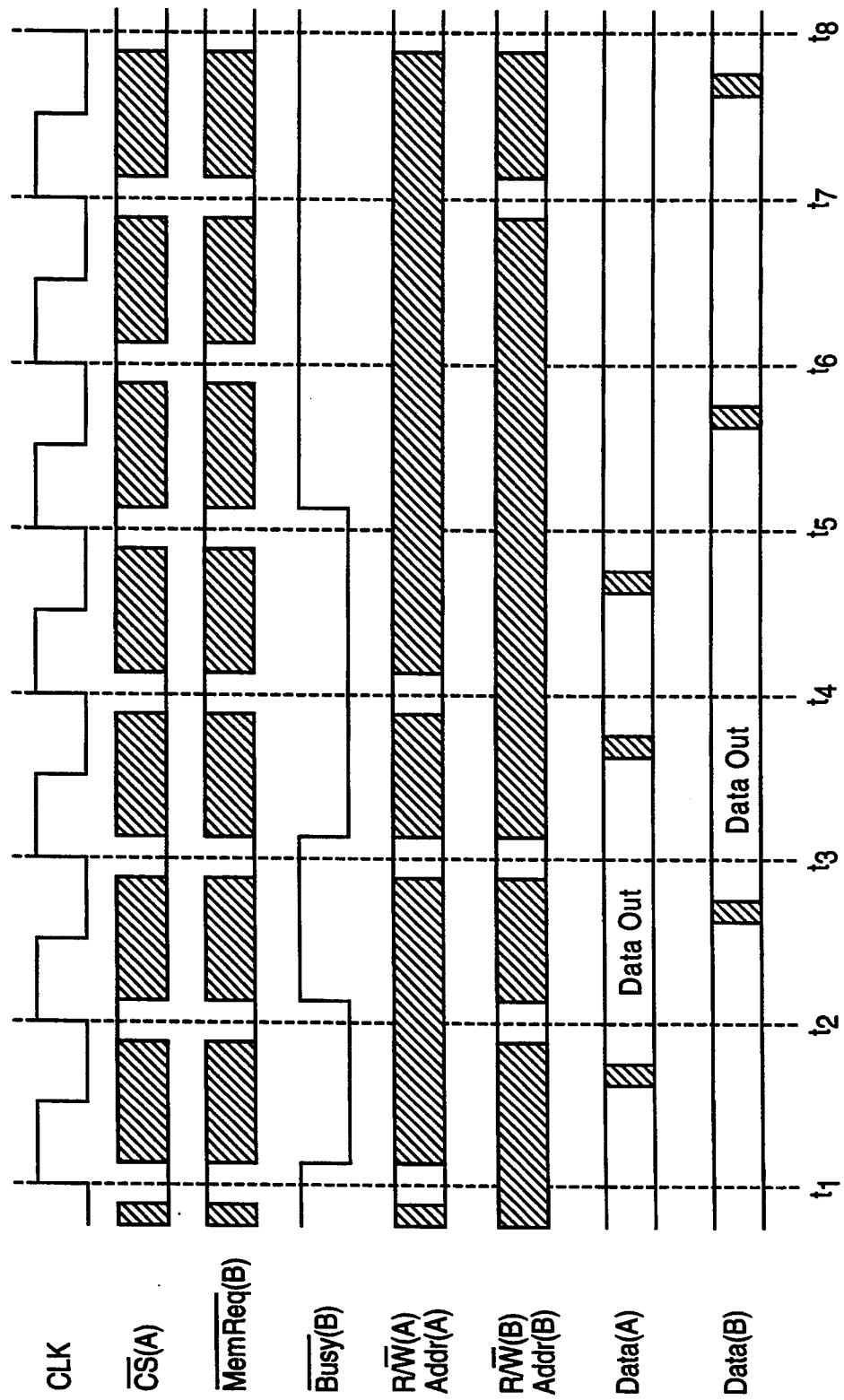
FIG. 4 is a timing diagram illustrating various read memory cycles of dual port memory 200.

FIG. 4 shows various read cycles of dual port memory 200. As shown in FIG. 4, at time $t_1$, memory request signal $\overline{CS}(A)$ from port A is asserted. In response to signal $\overline{CS}(A)$, signal $\overline{Busy}$ is asserted to block any memory access from port B. At the same time, type access signal R/$\overline{W}$(A) on lead 253 indicates a read access to the address provided on address bus 254. As a result of the active $\overline{Busy}$ signal, multiplexor 202 selects the address signals Address(A) on address bus 261 the access type signal R/$\overline{W}$(A) on lead 260, which have previously been received into register 217 from address bus 254 and lead 253 respectively. The data output of memory array 201 at output bus 234 is provided at a later time during the memory cycle of $t_1$.

At time $t_2$, memory request signal $\overline{MemReq}(B)$ is asserted. Since there is not a pending request from port A, the read operation from port B is allowed to proceed. As a result, the data output of memory array 201 is available on data bus 234 at the latter part of the memory cycle of $t_2$. Output signal $\overline{OE}(B)$ places via buffer 208 on data bus 252 the output data of data bus 234.

At time $t_3$, both memory access request signals $\overline{CS}(A)$ and $\overline{MemReq}(B)$ from ports A and B are asserted. In response to signal $\overline{CS}(A)$, signal $\overline{Busy}$ is asserted to block memory access by port B. However, the address signals Address(B) and access type signal R/$\overline{W}$(B) from port B are received into register 214. The output data of memory array 201, corresponding to the read memory request from port A, are provided on data bus 234 at the latter part of the memory cycle of time $t_3$.

At time $t_4$, the read memory request stored in register 214 remains blocked, due to another memory request from port A asserting signal $\overline{CS}(A)$. The output data of memory array 201, corresponding to port A's read memory access, are made available on data bus 234 at the latter part of the memory cycle of time $t_4$.

At time $t_5$, no memory access request arrives at port A. Accordingly, the memory request from port B, which is pending since time $t_3$, is allowed to proceed. The output data of memory array 201, corresponding to port B's read memory access request of time $t_3$, are made available on data bus 234 at the latter part of the memory cycle of time $t_5$.

At time $t_7$, a read memory access request arrives from port B. Since no pending memory access is pending from port A, read operation proceeds in the same manner as the read access of memory cycle of time $t_2$.

The detailed description provided above is intended to be illustrative of the disclosed embodiments, and is not intended to be limiting of the present invention. Numerous modifications and variations are possible within the scope of the present invention. The present invention is defined by the following claims appended hereto.

We claim:

1. A dual port memory, comprising:
   a memory element addressable by address signals for storing data;
   a first port receiving (i) a first set of address signals for accessing said memory element, and (ii) a first memory request signal for indicating a pending memory access from said first port;
   a second port receiving (i) a second set of address signals for accessing said memory element, (ii) a second memory request signal for indicating a pending memory access from said second port, and (iii) said first memory request signal, said second port providing said first memory request signal as a busy signal to indicate that, when said first memory request signal is asserted, said second port is temporarily unavailable; and
   a multiplexer controlled by said first memory request signal for selecting one of said first and second sets of address signals for accessing said memory element.

2. A dual port memory as in claim 1, wherein said first and second port each further receive an access type signal indicating whether a read access or write access is desired.

3. A dual port memory as in claim 2, further comprising first and second address registers for receiving said first and second sets of address signals, said first and second address registers being clocked by the same clock signal.

4. A dual port memory as in claim 3, wherein said first and second address registers receive said first and second memory access request signals.

5. A dual port memory as in claim 1, further comprising first and second data latches for receiving data to be written into said memory element from said first and second ports respectively.

6. A method for providing a dual port memory, comprising the steps of:
   providing a memory element addressable by address signals for storing data;
   providing a first port receiving (i) a first set of address signals for accessing said memory element, and (ii) a first memory request signal for indicating a pending memory access from said first port;
   providing a second port receiving (i) a second set of address signals for accessing said memory element, (ii) a second memory request signal for indicating a pending memory access from said second port, and (iii) said first memory request signal, said second port providing said first memory request signal as a busy signal to indicate that, when said first memory request signal is asserted, said second port is temporarily unavailable; and
   providing a multiplexer controlled by said first memory request signal for selecting one of said first and second sets of address signals for accessing said memory element.

7. A method for providing a dual port memory as in claim 6, wherein said steps of providing said first and second ports each further comprise the step of receiving an access type signal indicating whether a read access or write access is desired.

8. A method for providing a dual port memory as in claim 7, further comprising the step of providing first and second address register for receiving said first and second sets of address signals, said first and second address registers being clocked by the same clock signal.

9. A method for providing a dual port memory as in claim 8, wherein said step of providing said first and second address registers provides that said first and second address registers receive said first and second memory access request signals.

10. A method for providing a dual port memory as in claim 6, further comprising the step of providing first and second data latches for receiving data to be written into said memory element from said first and second ports respectively.

* * * * *